(12) United States Patent
Muranaga

(10) Patent No.: US 8,199,527 B2
(45) Date of Patent: *Jun. 12, 2012

(54) ELECTRONIC COMPONENT AND MANUFACTURING METHOD THEREFOR

(75) Inventor: Masakazu Muranaga, Yokohama (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 373 days.

This patent is subject to a terminal disclaimer.

(21) Appl. No.: 12/123,944

(22) Filed: May 20, 2008

(65) Prior Publication Data
US 2008/0292846 A1    Nov. 27, 2008

(30) Foreign Application Priority Data
May 21, 2007  (JP) ................... 2007-134441

(51) Int. Cl.
H05K 9/00    (2006.01)

(52) U.S. Cl. ........ 361/816; 361/818; 361/800; 174/350; 174/377

(58) Field of Classification Search ............... 361/800, 361/816, 818; 174/350, 377
See application file for complete search history.

(56) References Cited

U.S. PATENT DOCUMENTS

| | | | | |
|---|---|---|---|---|
| 4,754,101 A | * | 6/1988 | Stickney et al. | 174/383 |
| 4,838,475 A | * | 6/1989 | Mullins et al. | 228/179.1 |
| 5,400,949 A | * | 3/1995 | Hirvonen et al. | 228/180.22 |
| 5,422,433 A | * | 6/1995 | Rivera et al. | 174/382 |
| 5,530,202 A | * | 6/1996 | Dais et al. | 174/385 |
| 5,706,579 A | * | 1/1998 | Ross | 29/840 |
| 5,893,726 A | * | 4/1999 | Farnworth et al. | 438/108 |
| 5,990,418 A | * | 11/1999 | Bivona et al. | 174/546 |
| 6,136,131 A | * | 10/2000 | Sosnowski | 156/256 |
| 6,420,649 B1 | * | 7/2002 | Kahl et al. | 174/377 |
| 6,501,016 B1 | * | 12/2002 | Sosnowski | 174/382 |
| 6,552,261 B2 | * | 4/2003 | Shlahtichman et al. | 174/384 |
| 6,649,827 B2 | * | 11/2003 | West et al. | 174/377 |
| 6,796,485 B2 | * | 9/2004 | Seidler | 228/255 |
| 6,826,053 B2 | * | 11/2004 | Kato et al. | 361/715 |
| 7,142,435 B2 | * | 11/2006 | Goto et al. | 361/818 |
| 7,277,301 B2 | * | 10/2007 | Liang | 361/816 |
| 7,383,977 B2 | * | 6/2008 | Fagrenius et al. | 228/180.21 |
| 7,491,899 B2 | * | 2/2009 | Zuehlsdorf et al. | 174/372 |
| 7,764,513 B2 | * | 7/2010 | Miyamoto et al. | 361/816 |
| 2009/0016039 A1 | | 1/2009 | Imamura | |

FOREIGN PATENT DOCUMENTS

| | | |
|---|---|---|
| JP | 04-097398 U | 8/1992 |
| JP | 10-13078 | 1/1998 |
| JP | 11-177227 A | 7/1999 |
| JP | 2000-307231 | 11/2000 |
| JP | 2001-230362 A | 8/2001 |
| JP | 2002-185256 A | 6/2002 |
| JP | 2006-049381 A | 2/2006 |
| JP | 2006-196664 A | 7/2006 |

* cited by examiner

*Primary Examiner* — Dameon Levi
(74) *Attorney, Agent, or Firm* — Chen Yoshimura LLP

(57) ABSTRACT

When manufacturing an electronic component having a flip chip or a surface mount component mounted on a sheet substrate and being covered with a shield cover, the above shield cover is dipped into cream solder and placed on the above sheet substrate after the above cream solder is attached to the peripheral edge sides of the above shield cover, and then the shield cover is fixed to the sheet substrate by reflow process. With such manufacturing, it becomes possible to efficiently fix the shield cover to the sheet substrate. Also, the shield cover can securely be fixed against the bend of the sheet substrate produced during the reflow.

17 Claims, 8 Drawing Sheets

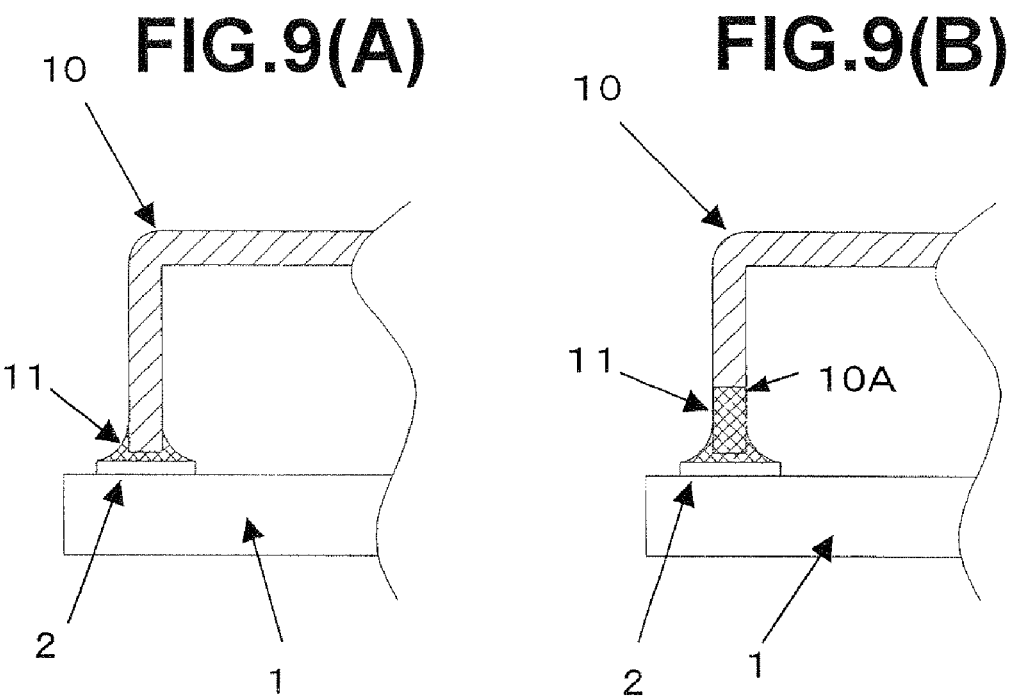

30

30                    32

ELECTRONIC COMPONENT AND MANUFACTURING METHOD THEREFOR

CROSS-REFERENCE TO RELATED APPLICATIONS

This application is based upon and claims the benefit of priority from the prior Japanese Patent Application No. 2007-134441, filed on May 21, 2007 the entire contents of which are incorporated herein by reference.

BACKGROUND OF THE INVENTION

1. Field of the Invention

The present invention relates to an electronic component and a manufacturing method therefor, and more particularly an electronic component configured of a flip chip or a surface mount component being mounted on a substrate and covered with a shield cover, and a manufacturing method therefor.

2. Description of the Related Art

In a communication apparatus such as a mobile phone, there is used an electronic component configured of a complex module in which a flip chip having a circuit function for a high frequency band or a surface mount component are mounted on a printed circuit board or an LTCC substrate (Low Temperature Co-fired Ceramics), which is covered with an electromagnetic shield cover (for example, Patent documents 1 (Japanese Unexamined Patent Publication No. 10-13078.), Patent documents 2 (Japanese Unexamined Patent Publication No. 2000-307231.)).

According to the invention described in Patent document 1, in regard to the electronic component for use in a high frequency circuit, a shield cover for electromagnetic shield is fixed to a substrate for mounting a plurality of components. The above fixation is made by forming on the above component mounting substrate through holes allowing insertion of claws of the shield cover, inserting the shield cover claws in the above through holes, and burying solder therein.

Also, according to the invention described in Patent document 2, by regarding the invention described in the above Patent document 1 as the prior art, it was pointed out that two processes had been necessary, namely a process for soldering a surface mount component on a substrate and a process for soldering a shield cover, and that the invention concerned was intended to improve the above prior art. Further, as a feature of the invention described in Patent document 2, it is urged that the process for soldering both the surface mount component and the shield cover on the substrate can be put into common by forming an electrode for case fixation on the side faces of the through holes into which the shield cover claws can be inserted.

Meanwhile, with the requirement in recent years to miniaturize electronic components, there has been a tendency of the use of a flip chip as a component to be mounted on a printed circuit board or an LTCC substrate (hereafter simply referred to as substrate). The flip chip is disposed via bumps, corresponding to a solder area placed on a substrate by a printing screen mask corresponding to an electrode pattern. Thereafter, fixation to the substrate is made by soldering using a reflow furnace.

At that time, to strengthen the adhesion of the flip chip to the substrate, after soldering the flip chip via the bumps, the underfill of the lower portion of the flip chip is made by use of a reinforcement resin.

Thereafter, further, a process of fixing the shield cover to the substrate by soldering is necessary. At this time, since the flip chip is already fixed to the substrate, it is not possible to use the printing screen mask to form a solder area to solder the shield cover.

SUMMARY OF THE INVENTION

Accordingly, in order to form an electrode pad area for fixing the shield cover to the substrate by soldering, there is considered a method of coating creamy cream solder, which is obtained by tempering solder particles with agent and flux, using a dispenser.

However, when using such the dispenser, there has been a problem that a long time is required for a coating work due to an unstable solder supply amount, because of the repeated processes of dispenser positioning movement and solder ejection.

Accordingly, it is an object of the present invention to provide an electronic component configured of a flip chip or a surface mount component mounted on a substrate and covered with a shield cover, and a manufacturing method therefor, enabling efficient fixation of a shield cover to a substrate and secure fixation of the shield cover even if the substrate is bent during reflow.

An electronic component to achieve the aforementioned object includes a sheet substrate, a functional element mounted on the sheet substrate, and a shield cover having an electromagnetic shield function for the functional element. The above shield cover has a quadrilateral lid shape, and includes four peripheral edge sides and a plurality of recesses on the respective four peripheral edge sides. Further, the above four peripheral edge sides having the plurality of recesses are fixed to the sheet substrate by soldering.

Alternatively, instead of including the above plurality of recesses, the electronic component according to the present invention includes inverse L-shaped notches respectively starting from the four peripheral edge sides, on the respective side faces of the shield cover, and areas separated by the notches from the side faces leaving one each side are bent inside the shield cover.

Further, according to the present invention, a manufacturing method of the electronic component having the above-mentioned features includes: coating with solder an electrode pad in each area of a plurality of module areas formed on a sheet substrate by screen printing; disposing the functional element corresponding to the electrode pad coated with solder; fixing the functional element to the sheet substrate by reflow process; dipping a shield cover of a quadrilateral lid shape having four peripheral edge sides into cream solder supplied to a transcription table, so as to attach the cream solder to the four peripheral edge sides; placing the four peripheral edge sides having the cream solder attached thereto on the sheet substrate in such a manner as to surround the functional element disposed on the basis of each module area; thereafter, fixing the shield cover to the sheet substrate by reflow process; and obtaining a discrete electronic component by cutting out on the basis of each module area by dicing the sheet substrate having the shield cover fixed thereto.

Further, as a preferable aspect, when the functional element disposed corresponding to the electrode pad coated with solder is a flip chip, prior to fixing the shield cover to the sheet substrate, bumps are formed in advance on the electrode pad over which the flip chip is to be placed, and the flip chip is disposed on the formed bumps, and the functional element is fixed to the sheet substrate by reflow process, and further, an underfill is formed on the lower side of the flip chip.

Further features of the present invention will become more apparent by the following description of the embodiments of the invention according to the accompanied drawings.

BRIEF DESCRIPTION OF THE DRAWINGS

FIGS. 9(A), 9(B) show partial cross sections illustrating solder fixation states of a shield cover to a sheet substrate.

DETAILED DESCRIPTION OF THE PREFERRED EMBODIMENTS

Figure 1:
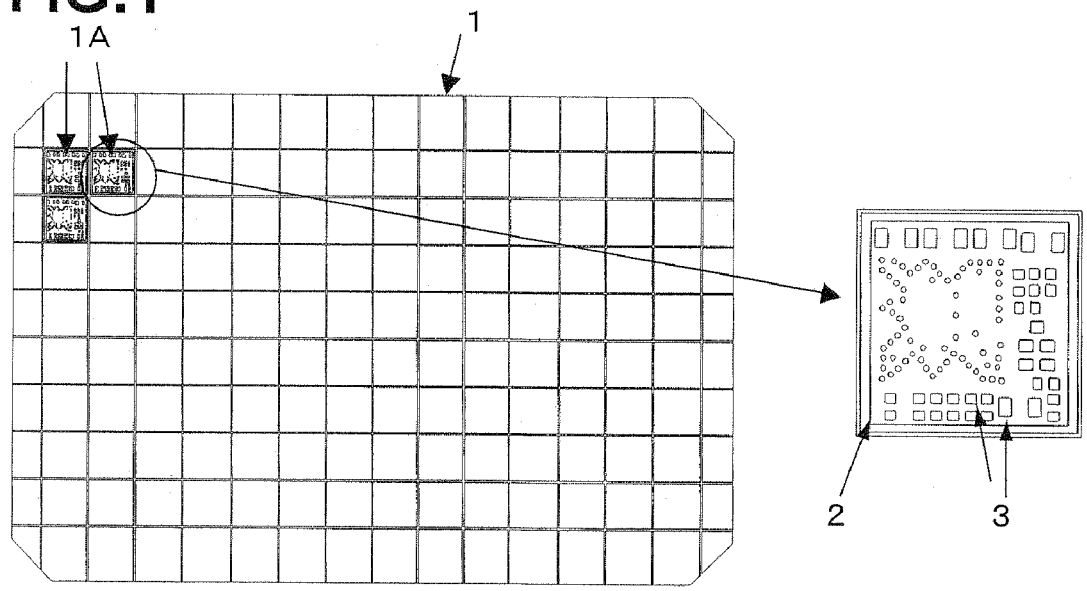
FIG. 1 shows a sheet substrate 1 as a printed circuit board or an LTCC substrate, on which a plurality of module areas each becoming a discrete electronic component are formed.

The preferred embodiment of the present invention is described hereinafter referring to the drawings. Prior to the description of the embodiments, the manufacturing method of an electronic component according to the prior art described earlier and the problems thereof will be explained again using the drawings, for the sake of better understanding of the application of the present invention.

FIG. 1 shows a sheet substrate 1, as a printed circuit board or an LTCC substrate, having a plurality of module areas 1A on which functional elements each becoming discrete electronic component are to be mounted.

(Process 1)

On the right side in FIG. 1, one module area 1A is shown in an enlarged manner. On the module area 1A, there are formed a shield pad 2 formed in the periphery on which the shield cover is to be connected with soldering, and foot electrode pads 3 for placing and connecting a flip chip and a surface mount component. Using a corresponding mask, solder is printed and coated on the above electrode pads by means of a screen printing unit.

(Process 2)

After Process 1, the surface mount component and the flip chip are placed on foot electrode pads 3 which are coated with solder by printing using the screen printing unit.

Figure 2:
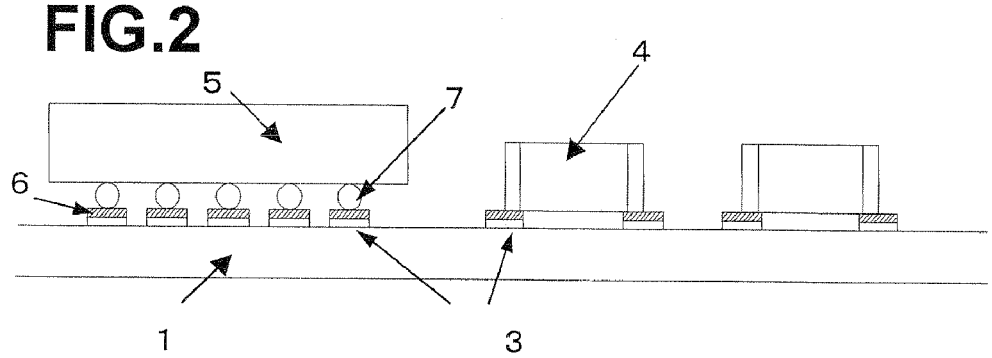
FIG. 2 shows a diagram illustrating a transverse plane of a portion of one module area in a state that a surface mount component or a flip chip is mounted on a sheet substrate shown in FIG. 1.

FIG. 2 is a diagram illustrating a transverse plane of a portion of one module area 1A in a state that a surface mount component 4 and a flip chip 5 are mounted as function elements on sheet substrate 1 shown in FIG. 1.

A solder layer 6 is printed and coated on foot electrode pads 3 of sheet substrate 1. Further, a surface mount component 4 is placed on the printed and coated solder layer 6 in such a manner that the terminal electrodes of surface mount component 4 correspond thereto. Further, flip chip 5 is placed in such a manner that terminal electrodes of flip chip 5 correspond to foot electrode pads 3 via bumps 7.

(Process 3)

Next, through reflow process, surface mount component 4 and flip chip 5 are fixed to sheet substrate 1 by soldering using the solder of solder layer 6.

(Process 4)

Figure 3:
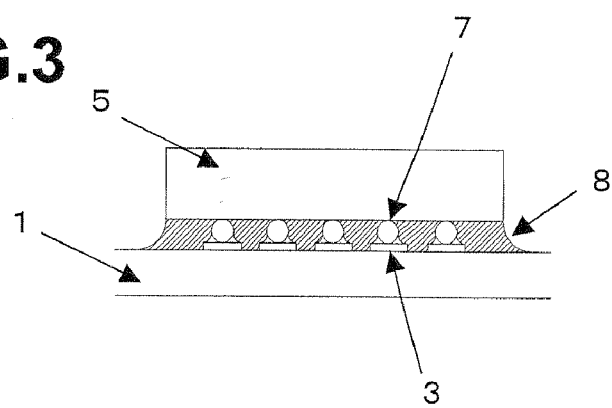
FIG. 3 shows a state that a reinforcement resin such as an underfill is formed on the lower side of a flip chip.

Further, to prevent bumps 7 from dropping off from flip chip 5 and to strengthen the mounting of flip chip 5 on sheet substrate 1, reinforcement resin 8 such as an underfill is coated on the lower side of flip chip 5 and hardened, as shown in FIG. 3.

(Process 5)

Figure 4:
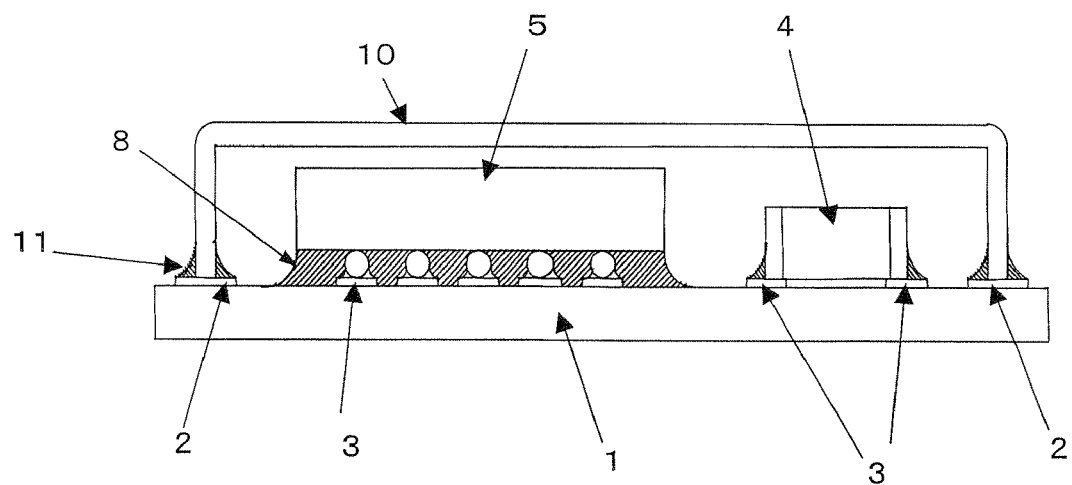
FIG. 4 shows a diagram explaining that a shield cover is covered and fixed corresponding to each module on a sheet substrate.

Next, as shown in FIG. 4, shield cover 10 is covered over sheet substrate 1 correspondingly to each module.

As to the fixation of shield cover 10 to sheet substrate 1, it is not possible to coat sheet substrate 1 with solder by use of a mask pattern because surface mount component 4 and flip chip 5 are already mounted on sheet substrate 1.

Therefore, as described in Patent documents 1, 2 explained earlier, there is considered a method of forming a protrusion along a peripheral edge side of shield cover 10, and forming a through hole in a manner as to be disposed along shield pad 2, and soldering by inserting the protrusion on the peripheral edge side of the above shield cover 10 into the through hole, or alternatively, a method of manually soldering the peripheral edge side of shield cover 10 with shield pad 2.

Figure 5:
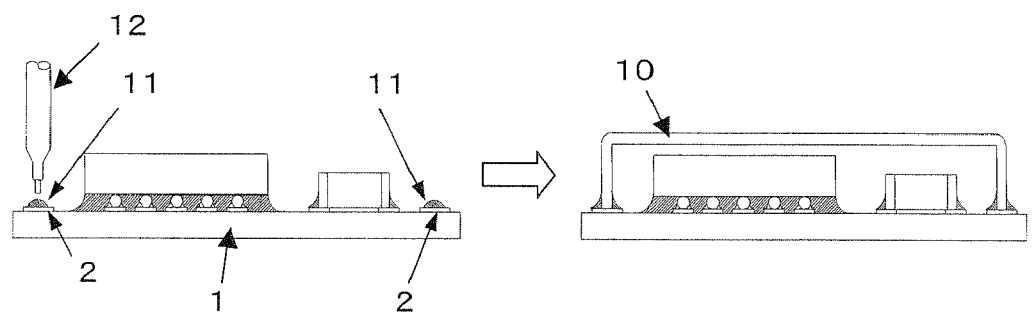
FIG. 5 shows a diagram explaining an example of solder fixation of a shield cover to a sheet substrate, using a dispenser unit.

Further, when using a dispenser unit to automate, as shown in FIG. 5, a tip 12 of the dispenser is moved along shield pad 2, while shield pad 2 is coated with solder. Next, shield cover 10 is placed on the solder coating and reflow is processed, so as to fix by soldering.

(Process 6)

Further, as a final process, surface mount component 4 and flip chip 5 are mounted and fixed on sheet substrate 1, which are then cut out by dicing on the basis of each individual module covered with shield cover 10, and thus discrete electronic components are obtained.

Here, in the process 5, that is, the method of fixing the above shield cover 10 to sheet substrate 1, according to the method of forming the above through hole, it is necessary to process sheet substrate 1 correspondingly to the process of shield cover 10. Soldering by manual work is not advantageous in view of industry. Further, according to the method of using the dispenser unit, as shown in FIG. 1, there is a problem of requiring a longer time for solder coating, as the number of individual modules 1A to be formed on sheet substrate 1 becomes larger.

Accordingly, the application of the present invention is intended to solve the above-mentioned problem. One exemplary structure of shield cover 10 to realize the present invention is shown in FIG. 6.

Shield cover 10 is of a quadrilateral lid shape having four peripheral edge sides 10A.

Figure 6:
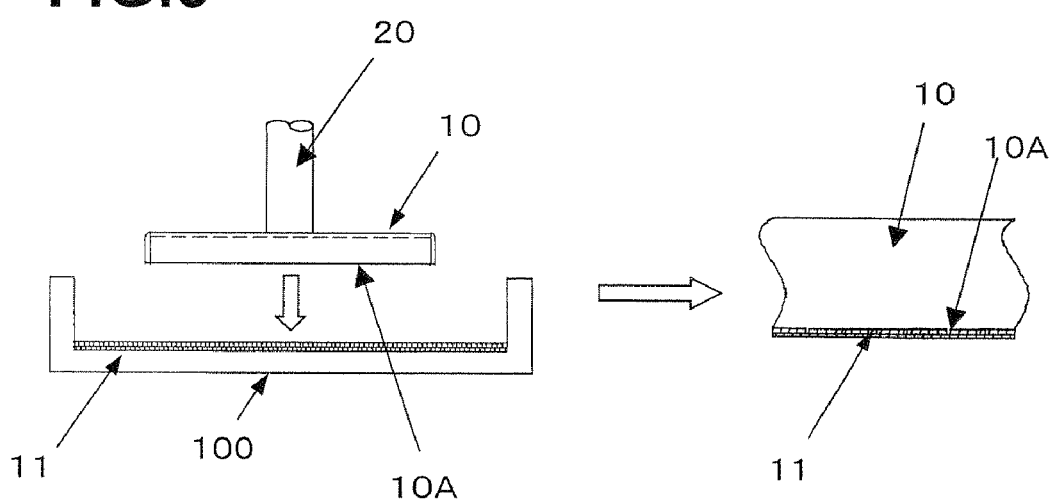
FIG. 6 shows a diagram illustrating one exemplary structure of a shield cover to realize the present invention.

FIG. 6 shows a diagram explaining processing according to the method of the present invention corresponding to the above process 5. As a feature of the present invention, to fix shield cover 10 to sheet substrate 1, solder is not coated on the sheet substrate 1 side, but attached to the shield cover 10 side.

Namely, in the example shown in FIG. 6, in a transcription table 100 to which creamy solder paste (cream solder) 11 is supplied, peripheral edge sides 10A of shield cover 10 are dipped in the state of holding shield cover 10 by means of a holder 20 of a non-illustrated automatic component mounting machine.

With this, as shown in enlargement on the right side of FIG. 6, cream solder 11 is attached to peripheral edge sides 10A of shield cover 10. Thus, in the above state, shield cover 10 is moved and disposed corresponding to shield pad 2 of sheet substrate 1, by means of the automatic component mounting machine.

Next, the reflow process is performed in a state that shield cover 10 is placed on sheet substrate 1, so as to fix shield cover 10 to sheet substrate 1 by soldering.

With the above method of the present invention, as compared with the conventional method, it is possible to remarkably shorten the time for the process 5 of fixing shield cover 10 to sheet substrate 1 by soldering.

Here, the thickness of sheet substrate 1 is in the order of 0.3 mm. Therefore, it is assumed that a bend is produced on sheet substrate 1 during the reflow process.

In such the case, even when the peripheral edge sides of shield cover 10 are uniformly dipped into cream solder 11 of transcription table 100 shown in FIG. 6, so as to attach cream solder 11, there is considered a case of an insufficient solder amount between the peripheral edge sides of shield cover 10 and sheet substrate 1, due to a bent sheet substrate 1 at the time of the reflow process.

Figure 7:
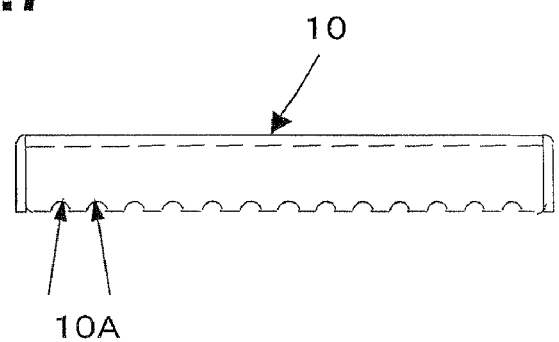
FIG. 7 shows a diagram illustrating a preferable shape of the peripheral edge side of a shield cover.

Considering the above situation, FIG. 7 shows a diagram illustrating a preferable shape of the peripheral edge side of shield cover 10.

Shield cover 10 includes four peripheral edge sides, of which one peripheral edge side is shown in FIG. 7. A plurality of recesses 10A of a semicircular shape, a quadrilateral shape or the like are formed on the respective four peripheral edge sides.

Figure 8:
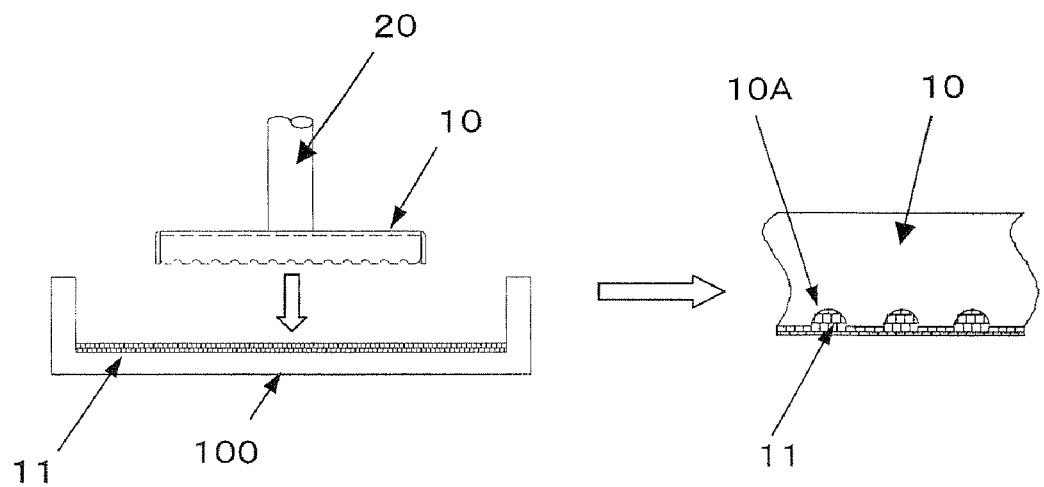
FIG. 8 shows a diagram explaining solder attachment to the peripheral edge side of a shield cover.

With this, as shown in FIG. 8, when the peripheral edge sides of shield cover 10 are dipped into cream solder 11 of transcription table 100, cream solder 11 is attached to both the peripheral edge sides of shield cover 10 and a plurality of recesses 10A formed on the peripheral edge sides.

It can be easily understood that a solder amount in such the state becomes greater than in the case explained in FIG. 6. Thus, even when sheet substrate 1 is bent during the reflow process, the above bend can be absorbed, and thus the fixation between shield cover 10 and sheet substrate 1 can be strengthened.

FIGS. 9(A), 9(B) show partial cross sections illustrating solder fixation states of a shield cover 10 sheet substrate 1. FIG. 9(A) is a connection state of a portion on which recess 10A is not formed on the peripheral edge sides of shield cover 10, while FIG. 9(B) is a connected state of a portion on which recesses 10A are formed. As shown in FIG. 9(B), shield cover 10 is connected to shield pad 2 by a greater solder amount in the portion on which recesses 10A are formed, as compared to the connection state of the portion without formation of recess 10A. With this, it is possible to avoid the influence of a bent sheet substrate 1 at the time of the reflow process.

FIGS. 10(A) to 10(D) show diagrams explaining other examples of recesses 10A provided on the four peripheral edge sides. In FIGS. 10(A) to 10(D), the side faces of shield cover 10 in the vicinity of the peripheral edge sides are shown in enlargement.

Figure 10A:
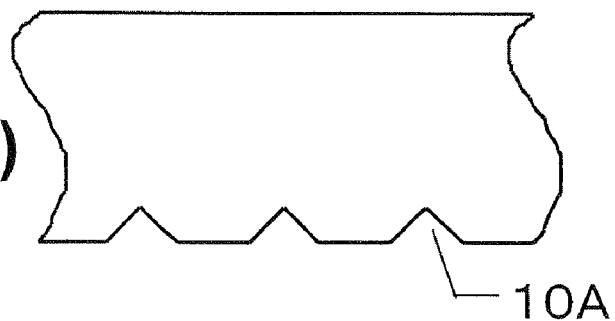
FIGS. 10(A) to 10(D) show diagrams explaining other exemplary recesses provided on four peripheral edge sides.
Figure 10B:
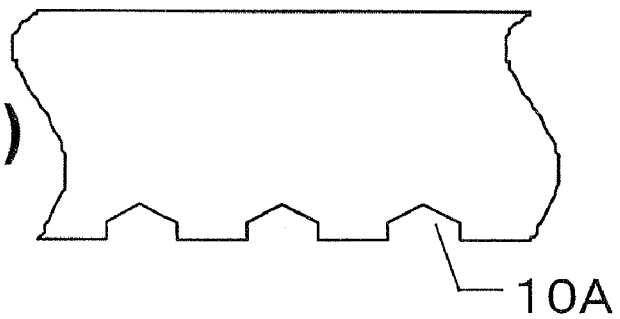
Figure 10C:
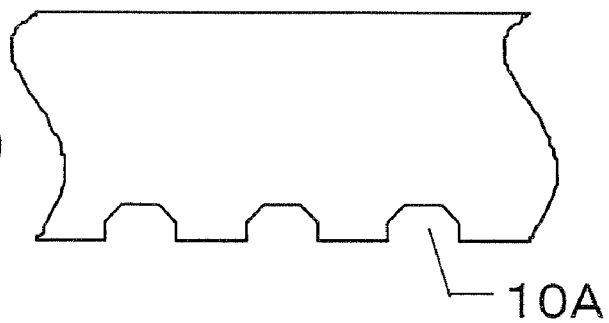
Figure 10D:
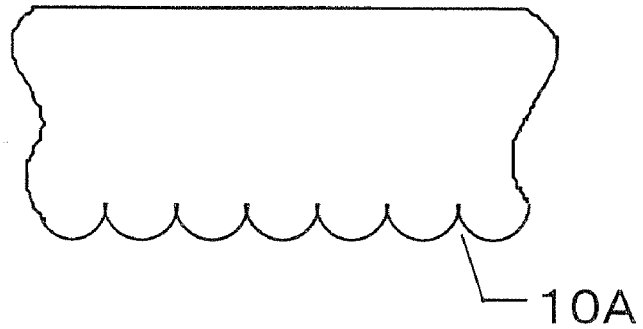

In the example shown in FIG. 10(A), triangular-shaped recesses 10A are formed on the peripheral edge sides of shield cover 10. In the examples shown in FIGS. 10(B) and 10(C), polygonal-shaped recesses 10A are formed on the peripheral edge sides of shield cover 10. In the example shown in FIG. 10(D), recesses 10A respectively sandwiched by neighboring semicircular-shaped areas are formed on the peripheral edge sides of shield cover 10.

Figure 11A:
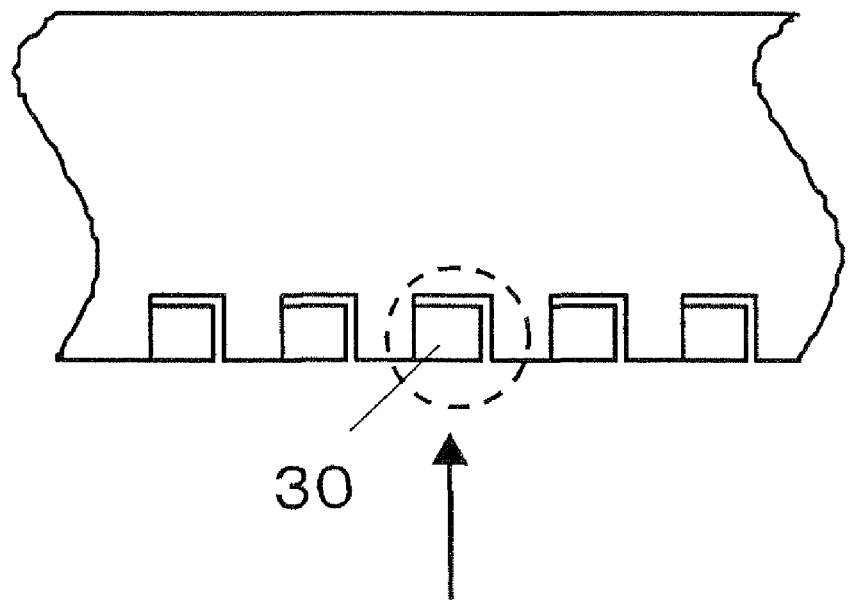
FIGS. 11(A), 11(B) show diagrams explaining another exemplary shield cover to increase solder attachment amount.
Figure 11B:
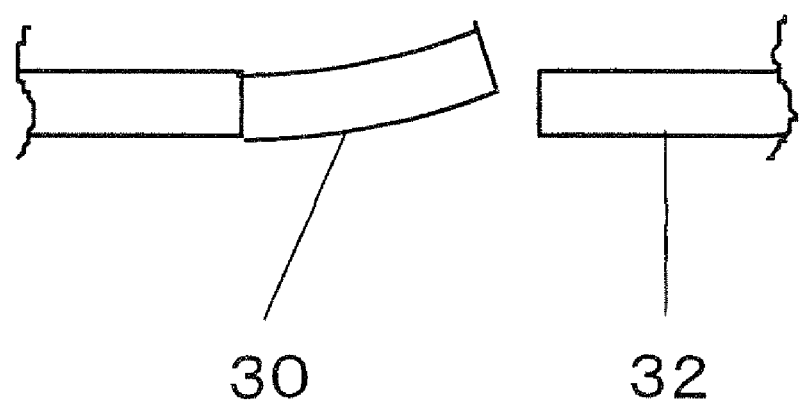

FIGS. 11(A), 11(B) show diagrams explaining other examples of the shield cover 10 with an increased solder attachment amount.

In FIG. 11(A), a side plan view of the above shield cover 10 is shown in enlargement. FIG. 11(B) is a diagram of the area surrounded by the circle shown in FIG. 11(A) when viewed from the arrow direction. As are apparent from FIGS. 11(A), 11(B), in the examples shown in FIGS. 11(A), 11(B), inverse L-shaped notches respectively starting from the four peripheral edge sides are provided on the side faces of shield cover 10. Areas 30 which are separated by the above notches from the above-mentioned side faces, each leaving one side, are bent inside shield cover 10. On the above shield cover 10, a large amount of solder is attached between each bent area 30 and each area 32 being opposite to the above bent area.

Figure 12A:
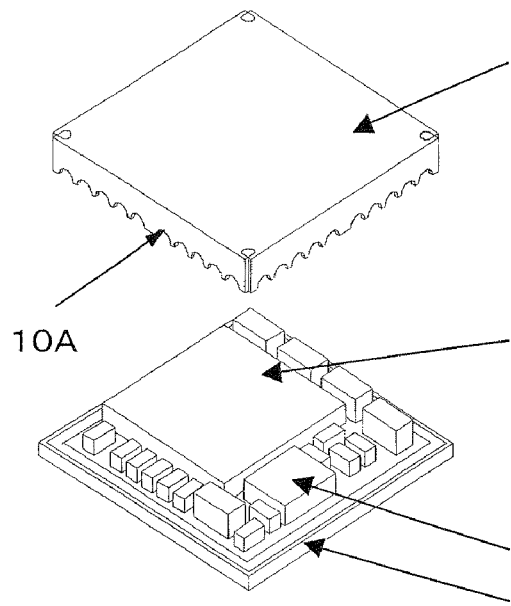
FIGS. 12(A), 12(B) show diagrams illustrating exemplary shapes of the peripheral edge sides of shield cover 10.
Figure 12B:
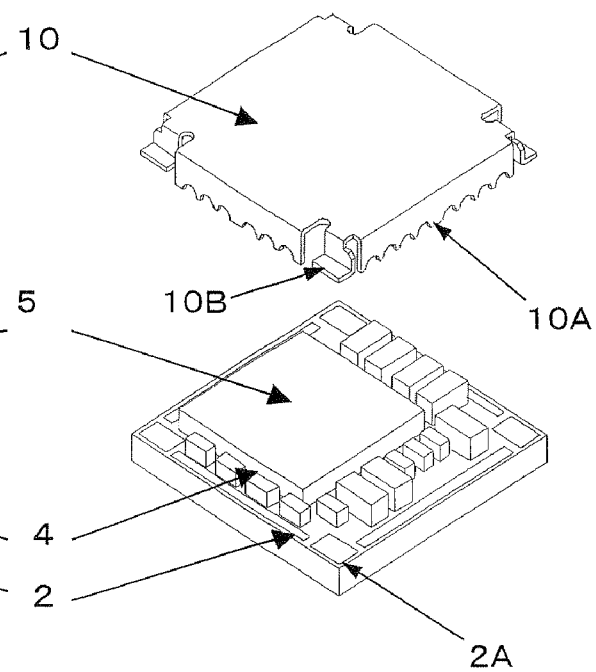

FIGS. 12(A), 12(B) show diagrams illustrating exemplary shapes of the peripheral edge sides of shield cover 10. FIG. 12(A) is an example in which a plurality of recesses 10A are similarly formed on the four sides of the peripheral edges of shield cover 10. Corresponding thereto, on the four sides of sheet substrate 1, shield pad 2 is formed in such a manner as to surround surface mount component 4 and flip chip 5 being mounted corresponding to each module.

In FIG. 12(B), there are formed plane portions L0B each having an L-shaped notch on each one side of the four peripheral edge sides of shield cover 10. Corresponding thereto, lands 2A are formed on sheet substrate 1. By this, there is produced a large soldering area between each plane portion 10B of shield cover 10 and each land 2A on sheet substrate 1, and thereby securer connection and fixation can be attained.

According to the above-mentioned method of the present invention, in the process 5 of soldering shield cover 10 with electronic components in which reinforcement resin 8 such as an underfill is coated on flip chip 5, solder is not supplied to the land electrode to connect to solder shield cover 10, which is shield pad 2. Instead, by supplying to the shield cover 10 side, it becomes possible to efficiently manufacture electronic components.

Further, in case of using a printed circuit board of a sheet shape, it is possible to solve a problem of a lack of solder caused by a shield cover being raised due to a bend by heat during the reflow, by providing recesses 10A as shown in FIG. 7 and FIGS. 9(A), 9(B).

Further, with the provision of plane portions 10B by notches, a contact area between solder 11 and shield cover 10, and land electrode 2A for connection as well, is increased. Thus, it is possible to obtain larger mechanical connection strength.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:
1. An electronic component comprising:
a sheet substrate;
a functional element mounted on the sheet substrate; and
a shield cover having an electromagnetic shield function for the functional element,
wherein the shield cover has a lid portion, side surfaces extending from a rim of the lid portion, a plurality of recesses provided on respective peripheral edges of the side surfaces, and solder attaching to the peripheral edges and attaching to the recesses,
wherein each of the recesses is shaped to be generally progressively wider towards the peripheral edge, and each of the recesses is filled with the solder in its entirety,
wherein the peripheral edges of the side surfaces excluding the plurality of recesses are all at substantially the same level, and
wherein the side surfaces are fixed to the sheet substrate by the solder.

2. The electronic component according to claim 1, wherein the recesses include notches starting from the peripheral edges.

3. The electronic component according to claim 1,
wherein a plane portion is formed on each one end side of the peripheral edges by an L-shaped notch, and
wherein the plane portion and a land formed on the sheet substrate side are connected by soldering.

4. The electronic component according to claim 1, wherein the functional element at least includes a flip chip, and is fixed to the sheet substrate via bumps, and an underfill is formed on the lower side of the flip chip.

5. A manufacturing method of an electronic component comprising:
coating with solder an electrode pad on a sheet substrate by screen printing;
disposing a functional element on the electrode pad coated with solder, and fixing the functional element to the sheet substrate by reflow process;
dipping a shield cover, which has a lid portion, side surfaces extending from a rim of the lid portion, and a plurality of recesses provided on respective peripheral edges of the side surfaces, into cream solder so as to attach the cream solder to all parts of the peripheral edges of the side surfaces and to the plurality of recesses provided on the peripheral edges;
placing the peripheral edges having the cream solder attached thereto on the sheet substrate to surround the functional element; and
thereafter, fixing the shield cover to the sheet substrate by reflow process,
wherein each of the recesses is shaped to be generally progressively wider towards the peripheral edge, and each of the recesses is filled with the solder in its entirety, and
wherein the peripheral edges of the side surfaces excluding the plurality of recesses are all at substantially the same level.

6. The electronic component manufacturing method according to claim 5, wherein
the functional element disposed on the electrode pad coated with solder is a flip chip, and prior to fixing the shield cover to the sheet substrate, a bump is formed in advance on the electrode pad over which the flip chip is to be placed,
the flip chip is disposed on the formed bump, and the functional element is fixed to the sheet substrate by reflow process, and
an underfill is formed on the lower side of the flip chip.

7. The electronic component manufacturing method according to claim 5,
wherein the recesses include notches starting from the peripheral edge.

8. The electronic component manufacturing method according to claim 5, wherein a plane portion is formed on each one end side of the peripheral edges by an L-shaped notch.

9. The electronic component according to claim 1, wherein the lid portion has a quadrilateral shape.

10. The electronic component according to claim 1, wherein the lid portion has a polygonal shape, and the peripheral edges of the side surfaces corresponding to corners of the polygonal shape of the lid portion are all at substantially the same level with other portions of the peripheral edges of the side surfaces excluding the plurality of recesses.

11. The electronic component manufacturing method according to claim 5, wherein the lid portion has a polygonal shape, and the peripheral edges of the side surfaces corresponding to corners of the polygonal shape of the lid portion are all at substantially the same level with other portions of the peripheral edges of the side surfaces excluding the plurality of recesses.

12. A method for manufacturing a plurality of modules from a sheet substrate having a pre-defined plurality of module areas, the method comprising:
coating with solder an electrode pad formed in each of the plurality of module areas of the sheet substrate;
in each of the plurality of modules areas, disposing a functional element on the electrode pad coated with solder, and fixing the functional element to the sheet substrate by reflow process;
for each of the plurality of modules areas, preparing a shield cover having a lid portion, side surfaces extending from a rim of the lid portion, and a plurality of recesses provided on respective peripheral edges of the side surfaces, and dipping each shield cover into cream solder so as to attach the cream solder to all parts of the peripheral edges of the side surfaces and to the plurality of recesses provided on the peripheral edges, wherein each of the recesses is shaped to be generally progressively wider towards the peripheral edge, and the peripheral edges of the side surfaces excluding the plurality of recesses are all at substantially the same level;
with respect to each of the plurality of modules areas, placing the peripheral edges of the shield cover having the cream solder attached thereto on the sheet substrate to surround the functional element;
thereafter, fixing the shield covers placed in respective modules areas to the sheet substrate by reflow process, each of the recesses being filled with the solder in its entirety; and
dicing the sheet substrate having the shield covers fixed thereto along dicing lines located adjacent to the respective side surfaces of the respective shield covers to separate the sheet substrate into the plurality of modules.

13. The method according to claim 12, wherein the functional element disposed on the electrode pad coated with solder is a flip chip, and prior to fixing the shield cover to the sheet substrate, a bump is formed in advance on the electrode pad over which the flip chip is to be placed,
wherein the flip chip is disposed on the formed bump, and the functional element is fixed to the sheet substrate by reflow process, and
wherein an underfill is formed on the lower side of the flip chip.

14. The method according to claim 12, wherein a plane portion is formed on each one end side of the peripheral edges by an L-shaped notch.

15. The method according to claim 12, wherein the lid portion of each of the shield covers has a quadrilateral shape, and each of the plurality of modules has a shape reflecting the quadrilateral shape.

16. The method according to claim 12, wherein the lid portion of each of the shield covers has a polygonal shape, and the peripheral edges of the side surfaces corresponding to corners of the polygonal shape of the lid portion are all at substantially the same level with other portions of the peripheral edges of the side surfaces excluding the plurality of recesses.

17. The method according to claim 12, wherein the sheet substrate is an LTCC substrate.

* * * * *